(12) United States Patent
Chandra et al.

(10) Patent No.: US 7,793,181 B2
(45) Date of Patent: Sep. 7, 2010

(54) SEQUENTIAL STORAGE CIRCUITRY FOR AN INTEGRATED CIRCUIT

(75) Inventors: Vikas Chandra, San Jose, CA (US); Sachin Satish Idgunji, San Jose, CA (US)

(73) Assignee: ARM Limited, Cambridge (GB)

( * ) Notice: Subject to any disclaimer, the term of this patent is extended or adjusted under 35 U.S.C. 154(b) by 352 days.

(21) Appl. No.: 12/078,192

(22) Filed: Mar. 27, 2008

(65) Prior Publication Data

US 2009/0245013 A1    Oct. 1, 2009

(51) Int. Cl.
G01R 31/28    (2006.01)
(52) U.S. Cl. .................................. 714/726; 714/724
(58) Field of Classification Search ............... 714/726, 714/718, 30; 365/185.33
See application file for complete search history.

(56) References Cited

U.S. PATENT DOCUMENTS

| | | | |
|---|---|---|---|
| 6,988,232 B2 * | 1/2006 | Ricchetti et al. | 714/736 |
| 7,493,536 B2 * | 2/2009 | Whetsel | 714/726 |
| 7,506,226 B2 * | 3/2009 | Gajapathy et al. | 714/718 |

OTHER PUBLICATIONS

S. Borkar, "Designing Reliable Systems From Unreliable Components: The Challenges of Transistor Variability and Degradation" IEEE Computer Society, 2005, pp. 10-16.
J.W. McPherson, "Reliability Challenges for 45nm and Beyond" DAC 2006, Jul. 2006, pp. 176-181.
W. Wang et al, "The Impact of NBTI on the Performance of Combinational and Sequential Circuits" DAC 2007, Jun. 2007, pp. 364-369.
X. Yang et al, "Combating NBTI Degradation via Gate Sizing" Proceedings of the 8th International Symposium on Quality Electronic Design (ISQED'07), 2007.
R. Vattikonda et al, "Modeling and Minimization of PMOS NBTI Effect for Robust Nanometer Design" 2004.
S. Kumar et al, "Impact of NBTI on SRAM Read Stability and Design for Reliability" Proceedings of the 7th International Symposium on Quality Electronic Design (ISQED'06), 2006.

* cited by examiner

Primary Examiner—Phung M Chung
(74) Attorney, Agent, or Firm—Nixon & Vanderhye P.C.

(57) ABSTRACT

Sequential storage circuitry is provided for an integrated circuit, comprising input circuitry, a storage structure, and output circuitry. The input circuitry receives an input data value to the sequential storage circuitry, and generates an internal data value. The input circuitry receives a first control signal which when asserted causes it to generate as the internal data value an inverted version of the input data value, and which when not asserted causes the input circuitry to generate as the internal data value the input data value. The storage structure then stores an indication of the internal data value. The output circuitry generates, from the indication of the internal data value stored in the storage structure, an output data value for outputting from the sequential storage circuitry. More particularly, the output circuitry receives a second control signal derived from the first control signal, which causes the output circuitry to generate as said output data value an inverted version of the internal data value in the event that the input circuitry generated as the internal data value an inverted version of the input data value, and otherwise generates as the output data value the internal data value.

20 Claims, 9 Drawing Sheets

(Latch is transparent when clk = 1)

FIG. 1

(Latch is transparent when clk = 1)

FIG. 2

(Latch is transparent when clk = 1)

FIG. 3

(Latch is transparent when clk = 1)

SEQUENTIAL STORAGE CIRCUITRY FOR AN INTEGRATED CIRCUIT

BACKGROUND OF THE INVENTION

1. Field of the Invention

The present invention relates to sequential storage circuitry for an integrated circuit.

2. Description of the Prior Art

As device geometries shrink (for example there is currently much development in the area of sub-45 nm technology design), this has pushed existing CMOS materials much closer to their intrinsic reliability limits. The stress observed in the devices at these reduced geometries causes them to age faster, which reduces the life of such devices. Many articles have been written concerning this reliability problem, see for example the article "Designing Reliable Systems from Unreliable Components: The Challenges of Transistor Variability and Degradation", by S Borkar, IEEE Micro November-December 2005, and the article "Reliability Challenges for 45 nm and Beyond" by J McPherson, IEEE Design Automation Conference (DAC), 2006. The reliability problem is often touted as one of the most important concern for future devices.

One of the major causes of an unreliable device is NBTI (Negative Bias Temperature Instability), as for example is discussed in the article "The Impact of NBTI on the Performance of Combinational and Sequential Circuits", by W Wang et al, IEEE Design Automation Conference (DAC), 2007. NBTI is an effect that primarily affects the PMOS devices, causing them to become stressed at higher temperature when the gate-source bias is negative. The usual impact of NBTI is an increase in the device threshold (Vt) over the life of the device, which slows the operation of the device down as it ages with use. Hence, the degradation of device threshold can manifest as path delay failures in the device. However, the shift in Vt is a function of the stress level on the device. A PMOS device which has a static logic "0" value at its gate and a static logic "1" value at its source is likely to get much more stressed than an equivalent PMOS device where the inputs (hence gate-source bias) change with time. The changing bias anneals the stress and hence it does not let the Vt degrade. A similar but reverse phenomenon happens for metal gate, high-k dielectric transistors. In this case, PBTI (Positive Bias Temperature Instability) stress impacts the NMOS devices in the design.

The NBTI and PBTI phenomena are not as much of a problem for any high activity domains of a chip because the stress gets annealed due to the bias changes that naturally occur in such high activity domains. However, any low activity domains are under much more stress due to almost static bias. If the static stress remains for a substantially long time, even a subsequent change in bias cannot recover the Vt degradation.

A common technique to design around this problem is to over-design and increase the margins of a device such that, over the lifetime of the device, the design is not affected by slow down. Such techniques are described, for example, in the article "Combating NBTI Degradation via Gate Sizing" by X Yang et al, IEEE International Symposium on Quality Electronic Design (ISQED), 2007, and the article "Modeling and Minimization of PMOS NBTI Effect for Robust Nanometer Design", by R Vattikonda et al, IEEE Design Automation Conference (DAC), 2006. Over-design with margins has become very expensive due to stringent area, performance and power demands for nanometer designs. The following are the common standard techniques (and their drawbacks) to reduce Vt degradation due to NBTI:

Vdd and Vt tuning: This involves determining an optimal value of Vdd/Vt ratio to minimize Vt degradation. However, every gate has a different optimal ratio and it is not possible to have an independent supply for every gate.

Gate sizing: This involves increasing the device size and over-design. However, as mentioned earlier, this has significant costs in terms of area and power.

Stack effect: This involves replacing a transistor with two or more transistors in series (a "stack"), which increases Vt due to the body effect. This hence reduces the effect of Vt degradation over time due to NBTI, but with a performance cost resulting from the use of stacked transistors.

Duty cycle control: This involves reducing the proportion of time that the gate of a PMOS device is at a logic "0" voltage level, which can reduce Vt degradation due to NBTI. However, such a step has a significant impact on other aspects of the architectural design of the system using such PMOS devices.

All of the techniques mentioned above are expensive to implement, either due to area increase, power increase, increase in complexity of the overall system design, or a combination of these factors.

In the area of SRAM memory, the article "Impact of NBTI on SRAM Read Stability and Design for Reliability", by S Kumar et al, Proceedings of the $7^{th}$ International Symposium on Quality Electronic Design (ISQED), 2006, describes a technique for reducing NBTI related stress in SRAM memory cells by causing the bits stored in an array of SRAM cells to be flipped occasionally. When a flip control signal is asserted, data is read from each SRAM cell in the array, flipped and stored back to the same cell, the process being performed for all SRAM cells in the array. This process is performed at a time when the processor associated with the SRAM array is in stand-by mode, thereby ensuring processor operation is not affected. Following such a procedure, a modified read and write mechanism is used when accessing the SRAM array to take account of the fact that the data has been flipped.

It is relatively easy to implement this method for SRAM arrays due to regular and localized design. The same technique cannot be used for sequential storage circuitry such as flip-flops and latches, or for the combinatorial circuitry interposed between such sequential storage circuitry, due to their spatial distributions on chip.

It would be desirable to develop a design of sequential storage circuitry which enabled mitigation of stress build up, whilst alleviating the power, area and complexity issues associated with the known prior art techniques.

SUMMARY OF THE INVENTION

Viewed from a first aspect, the present invention provides sequential storage circuitry for an integrated circuit, comprising: input circuitry for receiving an input data value to the sequential storage circuitry, and for generating an internal data value, the input circuitry receiving a first control signal which when asserted causes the input circuitry to generate as said internal data value an inverted version of the input data value, and which when not asserted causes the input circuitry to generate as said internal data value the input data value; a storage structure for storing an indication of the internal data value; and output circuitry for generating, from the indication of the internal data value stored in the storage structure, an output data value for outputting from the sequential storage circuitry, the output circuitry receiving a second control signal derived from the first control signal, which causes the output circuitry to generate as said output data value an inverted version of the internal data value in the event that the input circuitry generated as said internal data value an inverted version of the input data value, and otherwise to generate as said output data value the internal data value.

In accordance with the present invention the storage structure within sequential storage circuitry is provided between input circuitry and output circuitry. The input circuitry selectively flips the input data value received by the sequential storage circuitry, dependent on whether a first control signal is asserted or not, thereby generating an internal data value which will either be the input data value (when the first control signal is not asserted), or an inverted version of the input data value (when the first control signal is asserted). The storage structure then stores an indication of the internal data value, and the output circuitry then uses that stored information in order to generate an output data value, the output circuitry being responsive to a second control signal derived from the first control signal. By such an approach, the output circuitry can be arranged to generate as the output data value an inverted version of the internal data value if the input circuitry inverted the received input data value.

Thus, the sequential storage circuitry can be arranged to periodically flip the data value stored in the storage structure even when the data input is static, with the output also being flipped so that the downstream logic does not require any change in order to operate correctly. The mechanism of the invention was primarily designed to assist in reducing stress build-up in the storage structure of the sequential storage circuitry, but as will be discussed in more detail later, it can employed for other reasons, for example to improve security of the data stored within the sequential storage circuitry.

When compared with the known prior art techniques for seeking to reduce stress in the storage structure, the design of the present invention is simple to implement, and provides a great deal of flexibility in reducing stress in the distributed sequential storage circuits used in a typical integrated circuit. For example, compared with the prior art Vdd and Vt tuning technique, there are no extra Vdd pins required and no tuning of Vt is required. Compared with the earlier-mentioned gate sizing prior art, no special device resizing is required. Similarly, compared with the stack effect prior art there is no need to create stacks of transistors, thus avoiding the performance overhead of such a technique. Similarly, when compared with the duty cycle control prior art, there is no need to modify the duty cycle, and accordingly no architectural impact on the rest of the system design.

Further, when compared with the SRAM cell specific prior art mentioned earlier, the technique of the present invention can be applied to sequential storage circuits distributed widely throughout the integrated circuit, and is transparent to the other components of the integrated circuit with which the sequential storage circuits interact, in that no modification to their operation is required. More particularly, through use of the input and output circuitry of the present invention within each discrete sequential storage circuit, the flipping of the stored data value can be kept hidden from components external to the sequential storage circuit, in contrast with the earlier-mentioned SRAM cell specific prior art, which requires a modified read and write structure for interacting with the SRAM cells.

The invention hence provides a simple and effective mechanism which can be applied at the circuit level to anneal stress in distributed sequential storage circuitry of an integrated circuit.

The assertion of the first and second control signals, and the manner in which the second control signal is derived from the first control signal, can be managed in a variety of ways. However, in one embodiment, the storage structure is arranged to sample the internal data value generated by the input circuitry in the form that internal data value exists at a predetermined edge of a clock signal, the first control signal is asserted before said predetermined edge of the clock signal so as to cause the inverted version of the input data value to be generated before the predetermined edge of the clock signal, and following assertion of the first control signal, the second control signal is asserted in response to said predetermined edge of the clock signal.

The time at which the storage structure actually samples the internal data value will be dependent on the implementation of the storage structure. In one embodiment, the storage structure is a flip-flop storage structure, which is responsive to the predetermined edge of the clock signal to sample the internal data value generated by the input circuitry. As will be appreciated by those skilled in the art, a suitable flip-flop storage structure for such an implementation can be formed by a pair of master and slave latches connected in series.

In an alternative embodiment, the storage structure may itself be a latch, and the input data value is constrained not to change during a first phase of the clock signal following the predetermined edge of the clock signal, such that in a second phase of the clock signal the latch retains the internal data value existing at the time of the predetermined edge of the clock. As long as the input data value is constrained in such a manner, the sequential storage circuitry will still operate in the desired manner, ensuring that there is no need to make any changes to downstream combinatorial logic receiving the output of such sequential storage circuitry.

In one embodiment, a first time taken for the internal data value to transfer from the input of the storage structure to the output circuitry upon occurrence of the predetermined edge of the clock signal, and a second time taken for the second control signal to be generated responsive to said predetermined edge of the clock signal, are selected such that there is no change in the output data value resulting from the assertion of the first control signal. In accordance with such an embodiment, it is apparent that from a system level perspective, the sequential storage circuit's output does not change when its input is stable. However, the nodes inside the storage structure are toggled when the first control signal is asserted, thereby enabling any stress build-up to be annealed.

In an alternative embodiment, the first time taken for the internal data value to transfer from the input of the storage structure to the output circuitry upon occurrence of the predetermined edge of the clock signal, and the second time taken for the second control signal to be generated responsive to said predetermined edge of the clock signal, are selected such that a glitch is produced in the output data value resulting from the assertion of the first control signal, the glitch assisting in de-stressing combinatorial circuitry arranged to receive said output data value. In this embodiment, an intentional mismatch between the first time and the second time is introduced so as to cause a small glitch to be produced in the output value. It should be noted that the glitch generation is independent of which of the first time or the second time is shortened or lengthened in order to introduce the glitch.

By introducing such a glitch, this can help with de-stressing the downstream combinatorial logic. Since the output of the sequential storage circuit recovers to the original state within a short duration, the glitch does not affect the functionality, but it does assist in annealing the combinatorial logic. Hence, in such embodiments, the mechanism of the present invention not only assists in de-stressing the sequential storage circuit itself, but also assists in de-stressing the downstream combinatorial logic.

In one embodiment, the circuit overhead involved in producing a sequential storage circuit employing the technique of the present invention can be reduced by making use of pre-existing circuitry. For example, such sequential storage circuitry will often include a scan/data multiplexer that is used to select between normal operation input data and test mode scan input data. In such embodiments, the input circuitry can be arranged to generate the inverted version of the input data value, and then employ the scan/data multiplexer in normal operation to produce the internal data value by selecting between the input data value and the inverted version of the input data value dependent on the first control signal.

The output circuitry can be arranged in a variety of ways, and in particular the design of the output circuitry will depend on whether the storage circuitry itself produces a single output or multiple outputs. In one embodiment, the storage structure outputs the internal data value and an inverted version of the internal data value, and the output circuitry generates the output data value and an inverted version of the output data value, and the output circuitry comprises multiplexer circuitry controlled by the second control signal. Thus, when the second control signal is asserted following assertion of the first control signal, the output circuitry outputs the inverted version of the internal data value as the output data value, and outputs the internal data value as the inverted version of the output data value. Hence, in such embodiments, the output circuitry merely requires multiplexer circuitry to manipulate the outputs as required dependent on the second control signal. In an alternative embodiment, where the storage structure merely outputs the internal data value and no inverted version of the internal data value, an inverter can be added into the output circuitry to create the required values from which to select the output data value.

In one embodiment, on assertion of the first control signal, the first control signal remains asserted for a predetermined period and is then de-asserted. This predetermined period is a design parameter, which can be chosen dependent on the particular implementation, and the intended purpose of the state flipping, for example stress annealing, security, etc.

In one embodiment, the first control signal is asserted to anneal stress build-up in the storage structure. In one particular embodiment, the stress build-up results from gate-source bias temperature instability in transistors forming the storage structure, and changing the internal data value in dependence on the first control signal anneals the stress build-up. In one specific example, this gate-source bias temperature instability will take the form of negative bias temperature instability (NBTI) in PMOS transistors within the storage structure.

The technique of the present invention can reduce such stress build-up in any sequential storage circuits used throughout the integrated circuit. However, the use of such sequential storage circuitry is particularly beneficial in any low activity domains of the integrated circuit, where the inputs to such sequential storage circuits are expected to remain static for long periods, since it is in those situations that the stress build-up is particularly problematic.

In an alternative embodiment, the first control signal is asserted and de-asserted in accordance with a security control scheme to hamper detection of the data value being represented by the internal data value stored in the storage structure. Considering by way of example an integrated circuit having a plurality of such sequential storage circuits, such a security control scheme can be used to toggle the values stored in those sequential storage circuits even when the input data is not changing. In one particular example use, generation circuitry used to produce the first control signal may generate multiple first control signals, each first control signal being associated with a group of sequential storage circuits, such that the values stored in certain sequential storage circuits are toggled at different times to the values stored in other sequential storage circuits, thereby making state detection difficult.

Viewed from a second aspect, the present invention provides an integrated circuit comprising a plurality of sequential storage circuits interposed by combinatorial circuitry, at least one of the sequential storage circuits being formed by the sequential storage circuitry in accordance with the first aspect of the present invention.

In one embodiment, the integrated circuit includes latch circuitry for receiving the first control signal and for generating the second control signal following the predetermined edge of the clock signal. In embodiments where multiple sequential storage circuits are each arranged to use the technique of the present invention, the latch circuitry can be shared across those multiple sequential storage circuits, thereby reducing implementation overhead.

Viewed from a third aspect, the present invention provides a method of operating sequential storage circuitry for an integrated circuit, comprising the steps of: receiving an input data value to the sequential storage circuitry, and generating an internal data value, when a first control signal is asserted an inverted version of the input data value being generated as said internal data value, and when the first control signal is not asserted the input data value being generated as said internal data value; storing an indication of the internal data value in a storage structure of the sequential storage circuitry; and generating, from the indication of the internal data value stored in the storage structure, an output data value for outputting from the sequential storage circuitry, the output data value generated being dependent on a second control signal derived from the first control signal, such that an inverted version of the internal data value is generated as said output data value in the event that an inverted version of the input data value was generated as said internal data value, and otherwise the internal data value is generated as said output data value.

BRIEF DESCRIPTION OF THE DRAWINGS

The present invention will be described further, by way of example only, with reference to embodiments thereof as illustrated in the accompanying drawings, in which.

DESCRIPTION OF EMBODIMENTS

Figure 1:
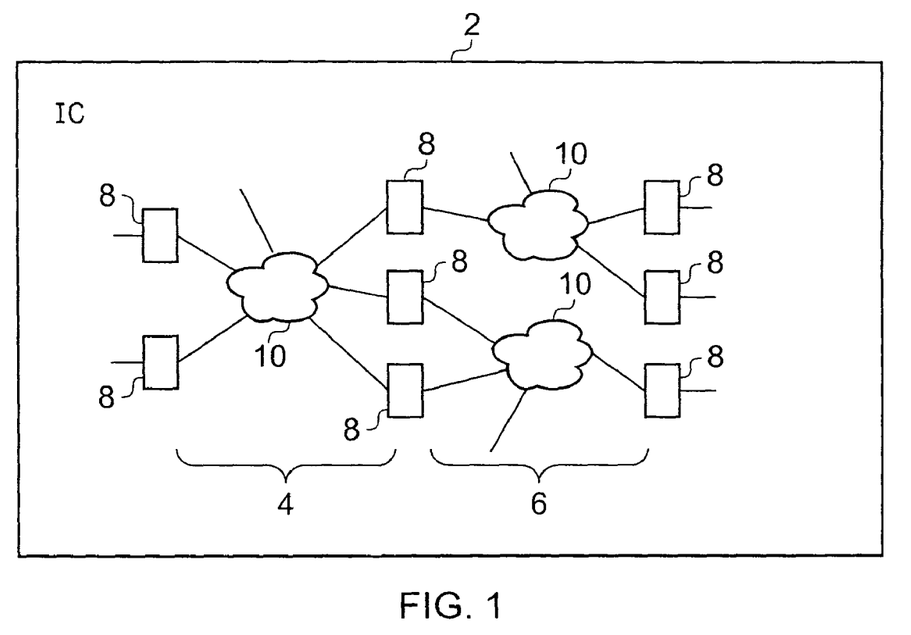
FIG. 1 schematically illustrates an integrated circuit incorporating sequential storage circuits, combinatorial logic and a pipelined architecture.

FIG. 1 shows an integrated circuit 2 including pipeline stages 4, 6 extending between sequential storage circuitry 8 which may be in the form of flip-flops or latches. Between the sequential storage circuits 8 are respective instances of combinatorial logic circuitry 10, which serve to receive signals from one or more preceding stages and generate signals to be passed to one or more succeeding stages. The period of time between the capture of signal values by the sequential storage circuits 8 for successive clock periods is the time that is available for the combinatorial logic circuitry 10 to evaluate its inputs so as to generate its outputs. Embodiments of the present invention provide a new design for the sequential storage circuit 8, which can serve to anneal stress build-up within the sequential storage circuit, and/or be used to improve security of the data stored therein.

For the purposes of discussing the following embodiments of the present invention, it will be assumed that the primary purpose of the new sequential storage circuit design is to anneal stress build-up in the PMOS devices of the sequential storage circuitry due to the NBTI phenomenon, but the sequential storage circuitry may be used in a similar manner in other use scenarios, for example when improving security, as will be discussed in more detail later with reference to FIG. 9.

Figure 2:
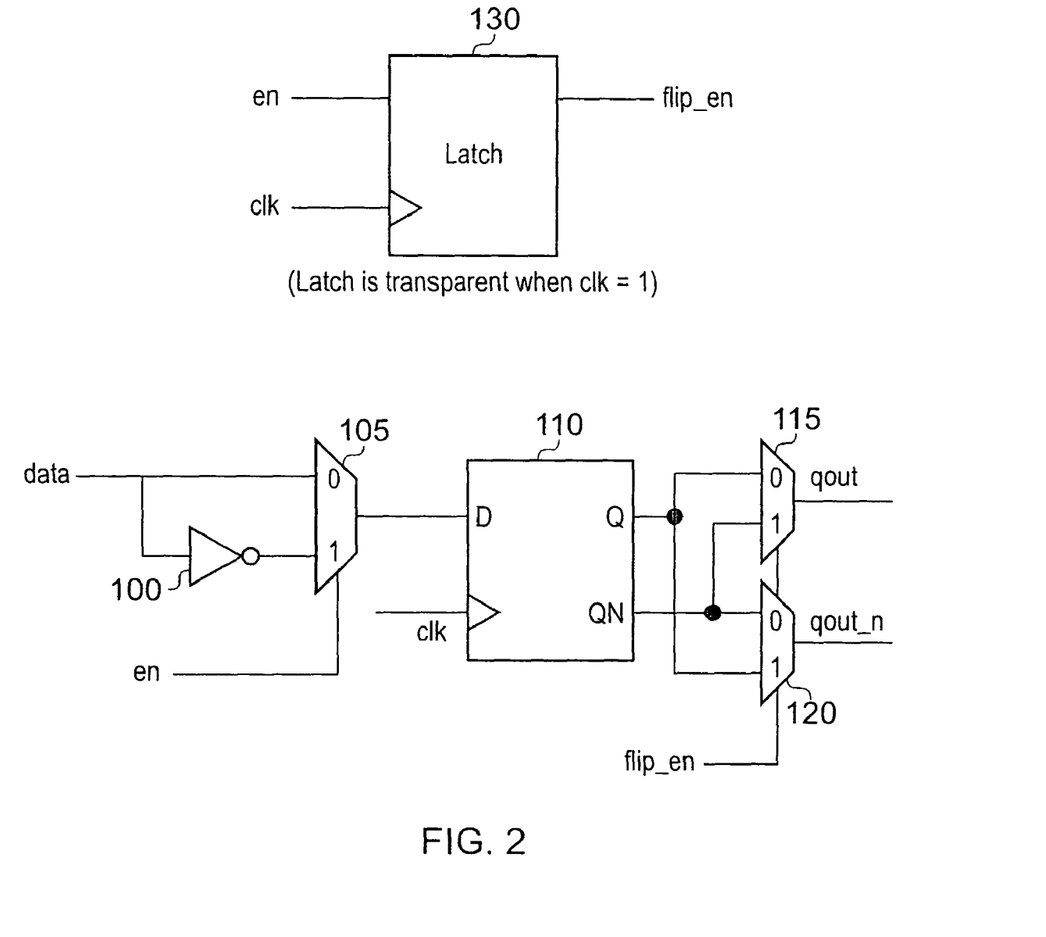
FIG. 2 illustrates the design of sequential storage circuitry in accordance with a first embodiment of the present invention, along with an associated latch used to generate the flip_en signal.

As shown in FIG. 2, the basic design of the sequential storage circuitry of embodiments of the present invention involves the use of input circuitry (in FIG. 2 this being formed by the elements 100 and 105) to receive an input data value and to generate therefrom an internal data value for storing in the storage structure 110, which can be implemented as a flip-flop or as a latch. If the storage structure 110 is implemented as a latch rather then a flip-flop, it will be necessary to place a constraint on the input data value ("data" as shown in FIG. 2), namely to ensure that that data does not change during a first phase of the clock signal. Output circuitry (in FIG. 2 this being formed by the multiplexers 115, 120) is then used to generate the output of the sequential storage circuitry based on the contents of the storage structure 110.

Such a structure of sequential storage circuitry allows the integrated circuit designer to select periods of time for which the storage structure will store the inverse of the input data value, as opposed to its normal mode of operation where it would store a representation of the input data value itself. In particular, an enable signal (also referred to herein as a first control signal) is input to the input circuitry of the sequential storage circuit to control the multiplexer 105 so as to determine whether the input provided to the D input of the storage structure 110 is the input data value itself, or an inverted version of that input data value as produced by the inverter 100. If the enable signal is to be asserted (in this embodiment assertion being at a logic one level), then this assertion will take place sufficiently ahead of the rising edge of the clock signal that the data provided to the D input of the storage structure is stable by the time that rising edge occurs. From FIG. 2, it will be apparent that the role of the enable signal is to determine the polarity of the data to be stored in the storage structure 110. In particular, when the enable signal is asserted, the inverse of the input data value is stored in the internal storage structure 110, whilst when the enable signal is de-asserted (at a logic zero level) the original input data is stored in the storage structure.

As also shown in FIG. 2, a latch 130 is provided for receiving the enable signal, and for outputting the enable signal as a flip_en signal (also referred to herein as a second control signal) following the rising edge of the clock signal. Hence, for a first phase of the clock signal whilst the clock signal is at the logic one level, the latch 130 becomes transparent, and flip-en is derived directly from the enable signal, with a small propagation delay introduced by the latch 130. Whilst a separate latch 130 could be provided for each sequential storage circuit, it is envisaged that such a latch 130 will typically be shared between multiple sequential storage circuits so that the enable signal and flip_en signal are shared amongst those multiple sequential storage circuits, thereby reducing the implementation overhead of the latch 130.

In the embodiment of FIG. 2, it is assumed that the storage structure 110 produces two output signals, namely a first output signal Q identifying the internal data value, and a second output signal QN identifying the inverted version of the internal data value. As can be seen, in such embodiments, the two multiplexers 115, 120 within the output circuitry then enable qout and qout_n to be selected appropriately depending on the flip_en signal. In particular, whilst the flip_en signal is at a logic zero level, the Q output will be connected directly to the qout path, and the QN output will be connected to the qout_n path. However, if the flip_en signal transitions to the logic one state, due to the en signal having been asserted, the multiplexer circuitry 115, 120 will cause the QN output to be connected to the qout path and the Q output to be connected to the qout_n path.

Accordingly, it can be seen that the arrangement described in FIG. 2 allows the value stored in the internal storage structure 110 to be flipped periodically via assertion of the enable signal, even when the data input is static. Further, the output from the sequential storage circuit is also in such instances inverted so that any downstream logic connected to the output of that sequential storage circuit does not require any change to its operation. Hence, following a certain period of inactivity, the enable signal can be asserted to cause the internal state of the storage structure 110 to be flipped, to thereby anneal any stress build-up within the PMOS devices of that storage structure. Following a predetermined de-stress period, the enable signal can then be de-asserted to restore the internal data value to its original state.

Figure 3:
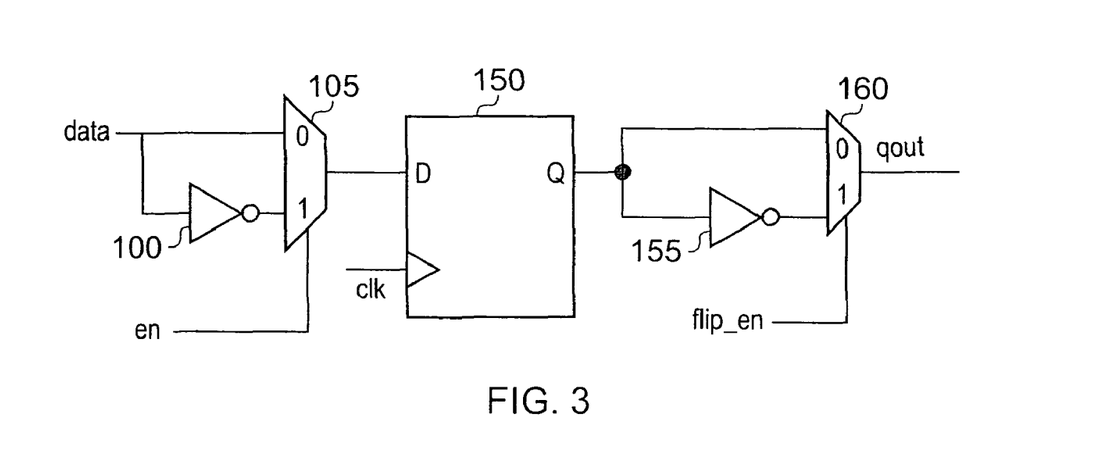
FIG. 3 illustrates the design of sequential storage circuitry in accordance with an alternative embodiment of the present invention, along with an associated latch used to generate the flip_en signal.

Whilst FIG. 2 shows one implementation of the sequential storage circuit, it will be appreciated that there are many ways in which the circuitry can be altered whilst achieving the same result. For example, FIG. 3 shows an embodiment where the storage structure produces only a single output Q. Those elements which are the same as in FIG. 2 are shown with the same reference numerals. Accordingly, it can be seen that the input circuitry does not change, but the storage structure 150 now only has a single output. As a result, the output circuitry (now formed by the inverter 155 and the multiplexer 160) is changed so that the output data value on the qout path can be generated appropriately dependent on any inversion performed by the input circuitry. Accordingly, if the flip_en signal is asserted, the inverter 155 will generate an inverted version of the internal data value stored within the storage structure 150, thereby reversing the effect of the inverter 100 on the input circuitry path.

Figure 4:
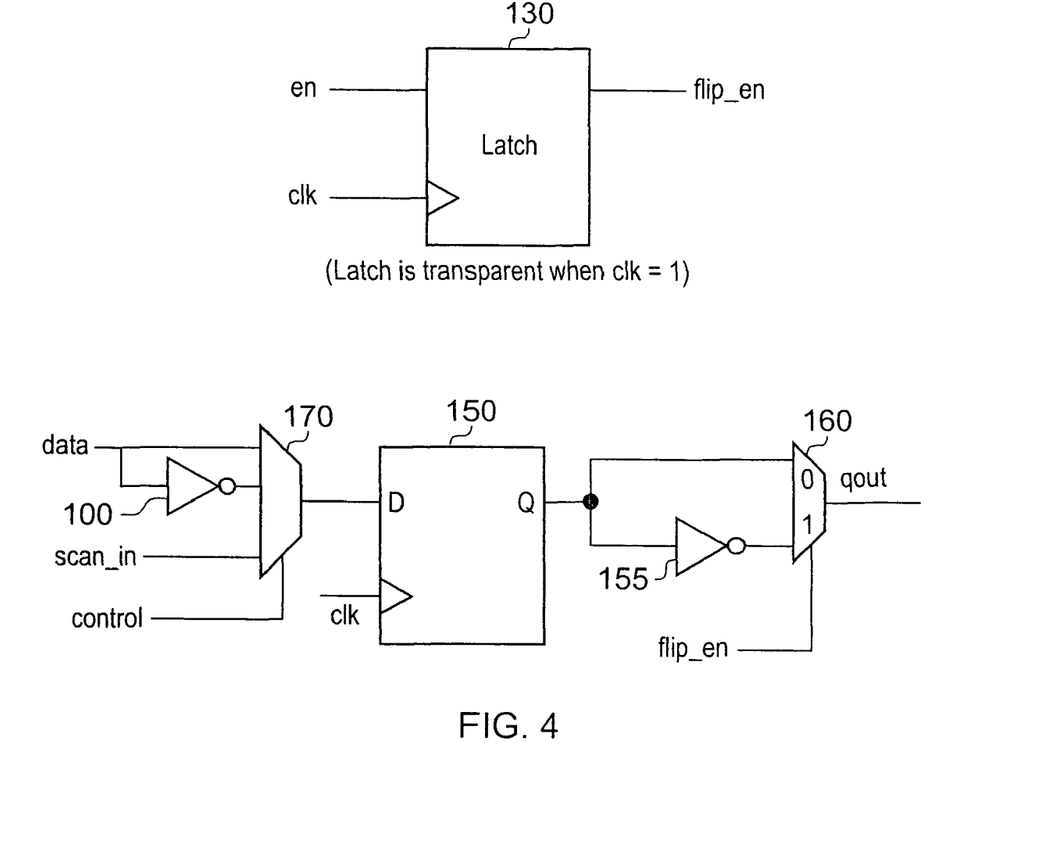
FIG. 4 illustrates the design of sequential storage circuitry in accordance with another alternative embodiment of the present invention, along with an associated latch used to generate the flip_en signal.

FIG. 4 shows a further variant where the overhead associated with providing the input circuitry is reduced by using a pre-existing multiplexing element within the sequential storage circuit design. In particular, it is often the case that a sequential storage circuit will have a scan/data multiplexer for selecting between normal operation input data and test mode scan input data. In particular, the scan_in path allows test data to be input directly into the storage structure during test mode operations, but in normal use is not used. Accordingly, the scan/data multiplexer 170 can be extended so as to allow the functionality of the multiplexer 105 to be incorporated within it, with the multiplexer 170 receiving an appropriate control signal to select between its various inputs. During normal operation, the control signal will be derived from the enable signal so as to select the data input or the inverted version of the data input, dependent on whether the enable signal is asserted or not. The remainder of the circuitry in FIG. 4 remains unchanged from that discussed above in relation to FIG. 3. It will also be appreciated that the modification to the input circuitry shown in FIG. 4 can also be applied to the design of FIG. 2.

FIGS. 2 to 4 are not intended to provide an exhaustive list of implementations for the sequential storage circuitry, but rather are intended to illustrate that the circuitry can be modified in a variety of ways, provided that the storage structure is located between input circuitry and output circuitry that operate in the above described manner to allow occasional flipping of the internal state of the storage structure 150 even in situations where the input data does not change, without requiring any modification to downstream logic connected to the output of the sequential storage circuitry.

Figure 5:
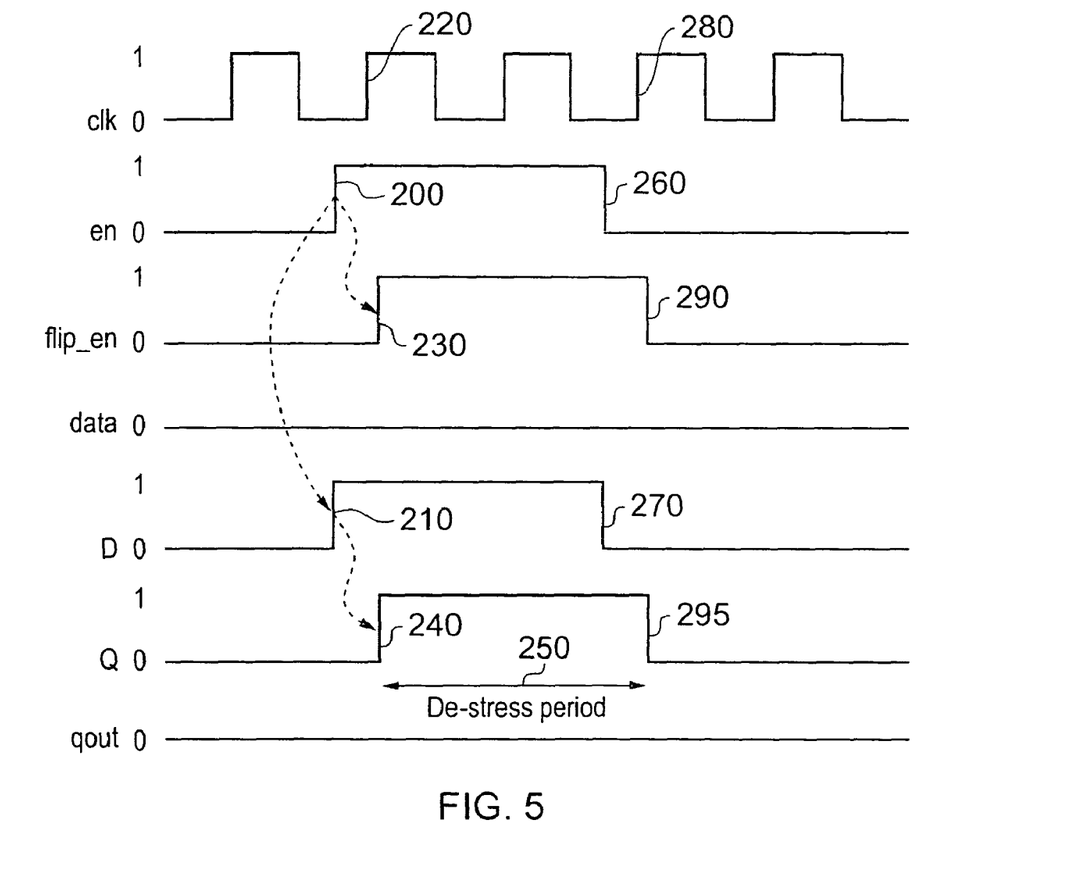
FIG. 5 illustrates the operation of the sequential storage circuitry in accordance with one embodiment to the present invention.

FIG. 5 is a timing diagram illustrating the operation of the sequential storage circuitry of FIG. 2 in accordance with one embodiment. The same basic timing diagram would also apply for the other example embodiments shown in FIGS. 3 and 4. As shown in FIG. 5, the data input is stable, and then the enable signal en is asserted at point 200, the enable signal being asserted sufficiently ahead of the next rising edge 220 of the clock signal so as to meet the set-up time requirement with respect to the clock signal. The assertion of the enable signal also toggles the input signal which feeds into the D pin of the storage structure, as shown by the rising edge 210. At the rising edge 220 of the clock signal, the latch 130 shown in FIG. 2 becomes transparent, and so the flip_en signal also transitions, as shown by the rising edge 230.

At this point, two things happen in parallel. Firstly, the toggled D value propagates to the Q output, causing the rising edge 240 on the Q output, and at the same time the flip_en signal selects QN to propagate to the qout path. If the two paths are balanced, qout does not toggle. Hence, in essence, when the enable signal en is asserted at a logic one level, the sampled data is the inverted version of the input data, and the qout and qout_n paths have the data that is supplied to them toggled, so that the QN output from the storage structure is past to the qout path and the Q output from the storage structure is passed to the qout_n path. Accordingly, from a system level perspective, the output of the sequential storage circuit does not change when the data is stable, but all of the nodes inside the storage structure toggle, thereby enabling the stress build-up to be annealed. This basic operation of the sequential storage circuitry is set out in Table 1 below:

TABLE 1

| en | Operation of the storage circuit |
|---|---|
| 0 | Normal Operation |
| 1 | inverted data is sampled, Q and QN are flipped |

As also shown in FIG. 5, following the de-stress period 250 the enable signal is de-asserted at point 260 which then causes the input signal at the D input of the storage structure to transition back to a logic zero level, as shown by edge 270. On the next rising edge 280 of the clock, the flip_en signal transitions back at point 290 to a logic zero level given the transition 260, and also the Q output transitions back to a logic zero level at point 295, given the transition 270.

Figure 6:
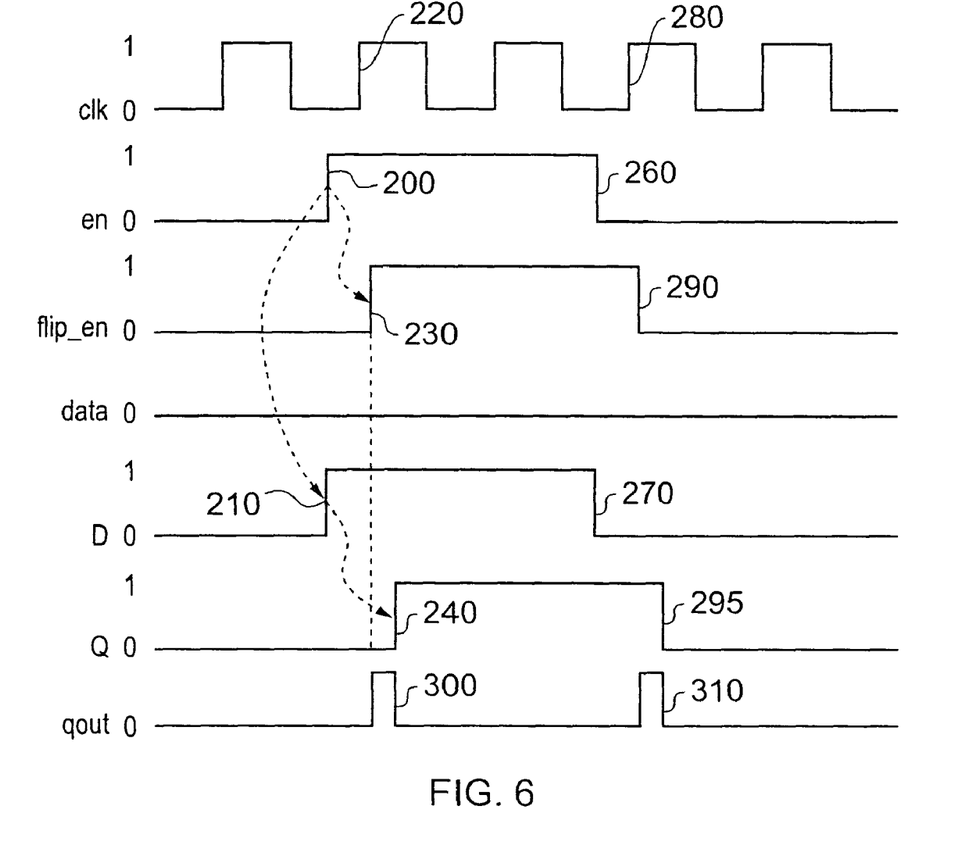
FIGS. 6 and 7 illustrate how a glitch can be introduced in the output from the sequential storage circuitry in accordance with certain embodiments of the present invention.
Figure 7:
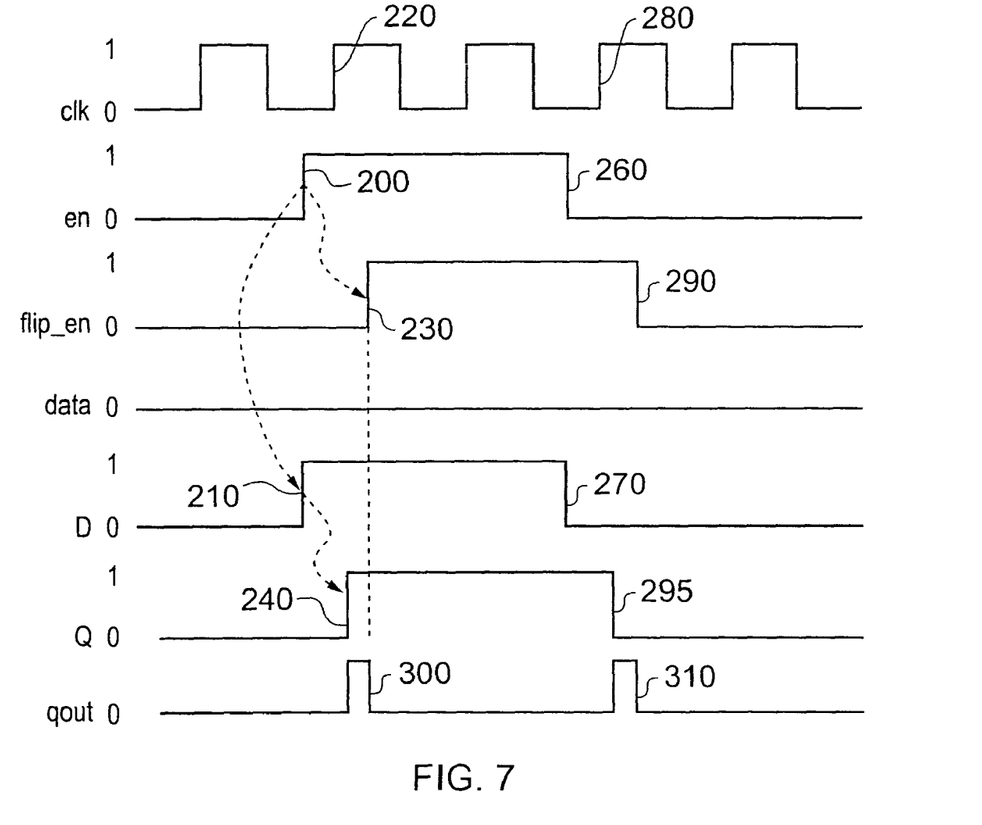

As discussed above, there is a race condition between two paths, which if matched ensure that the qout signal does not change. However, in one embodiment steps can be taken to positively introduce a mismatch between the two paths, such that there is a glitch in the qout signal. This can either be done by increasing the time taken for the data to pass from the input of the storage structure to the output circuitry (hence increasing the time between the rising edge of the clock and the Q output changing) as shown in FIG. 6, or by arranging the latch 130 to further delay the generation of the flip_en signal as shown in FIG. 7. From a review of FIGS. 6 and 7, it is interesting to note that irrespective of how the mismatch is introduced, the glitches 300, 310 introduced in the qout signal are the same. In particular, as long as there is a mismatch, a glitch at qout will be produced as shown in FIGS. 6 and 7.

In most cases, glitches are undesirable even though they do not affect functionality. Dynamic power consumption is one of the primary reasons designers tend to minimise glitches. In this case, however, such glitches can help in de-stressing the downstream combinatorial logic within the integrated circuit. Since the node qout recovers to the original state within a short duration, the glitch does not affect the functionality, but it does assist in annealing the combinatorial logic. The width of the glitch can be controlled by padding delays, for example introduced in the path generating the flip_en signal from the enable signal through the latch 130. Accordingly, by such an approach, the bit-flipping operation employed within the sequential storage circuitry not only de-stresses the transistors in this sequential storage circuitry itself, but also any transistors in the downstream combinatorial logic. It should however be noted that the propagation of the glitch within the combinatorial gates will depend on the logic, and logical/electrical masking may in some instances prevent the propagation of the glitch through the entirety of the combinatorial logic.

Figure 8:
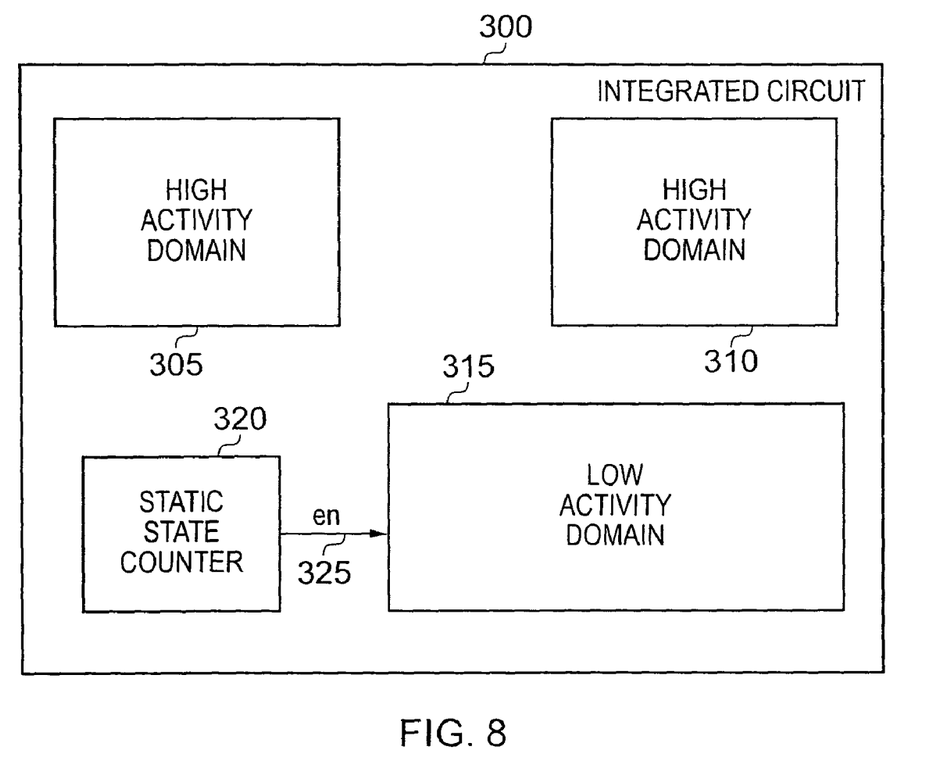
FIG. 8 illustrates the use of the techniques of embodiments of the present invention in association with sequential storage circuitry found in a low activity domain of an integrated circuit.

FIG. 8 schematically illustrates an integrated circuit 300 in which the sequential storage circuits of embodiments of the present invention may be employed. As shown in FIG. 8, the integrated circuit may be viewed as comprising a number of domains, certain of those domains 305, 310 being high activity domains, and certain of those domains being low activity domains 315. Whilst in FIG. 8 only a single low activity domain is shown, it will be appreciated that more then one low activity domain may be present.

Whilst the sequential storage circuits of embodiments of the present invention may be employed throughout the integrated circuit, and hence in both the high activity and low activity domains, there is an overhead in implementing such sequential storage circuitry, due to the need to provide the input circuitry and the output circuitry, and accordingly in one embodiment such sequential storage circuits are only used within any low activity domains 315. A static state counter circuit 320 is then used to monitor the period of time that the low activity domain 315 has been static, and if that period reaches a predetermined threshold, then an enable signal is asserted over path 325 to cause the sequential storage circuits to flip their internal state using the mechanisms described earlier.

From the above description of embodiments of the present invention, it will be seen that such techniques provide a circuit level mechanism for mitigating wearout in the distributed sequential storage circuits of an integrated circuit. In particular, the approach of such embodiments can reduce stress in such sequential storage circuits, and hence slow down the ageing process that can otherwise lead to incorrect operation. Further, by intentionally producing a short glitch at the output of such sequential storage circuits, the downstream combinatorial logic can also be briefly annealed.

Using embodiments of the present invention, low activity storage circuits can be de-stressed by a control signal, that can be controlled by user design. Further, intentional short glitches can be generated at the output of such circuits in order to anneal the downstream combinatorial logic. To employ this scheme, just one extra control signal is required (the enable signal, along with its related flip_en signal) and the overhead involved in this is akin to a clock gating flop or state retention flop. Further the latch 130 used in embodiments of the present invention can be shared across multiple sequential storage circuits thereby reducing the overhead involved. Furthermore, since the enable signal is asserted ahead of the clock signal, its use only imposes a small delay overhead in the propagation of the signal to the Q output of the storage structure, due to the multiplexer required to select between the input data value and an inverted version of the input data value.

In the above FIGS. 2 to 7, it is assumed that the storage structures 110, 150 are flip-flops, which are edged triggered devices. However, it is possible for these storage structures to also be implemented as latches, provided that the input data to the sequential storage circuit is constrained not to change during the first (high) phase of the clock signal. Assuming that constraint is met, the operation is still as shown schematically in FIGS. 5 to 7.

Whilst in the above discussion, it has been assumed that the primary purpose for the use of the sequential storage circuit designs of embodiments of the present invention is to de-stress the transistors within the storage structure, the inventors of the present invention have realised that such a structure can also have other benefits. By way of example, FIG. 9 illustrates an integrated circuit 400 where at least a part of the integrated circuit (and potentially all of the integrated circuit) forms a security enhanced domain 410. Within the security enhanced domain, the sequential storage circuits are formed using the techniques of embodiments of the present invention, and enable generation circuitry 420 is used to assert and de-assert at least one enable signal used to cause the internal state of those sequential storage circuits to flip.

Figure 9:
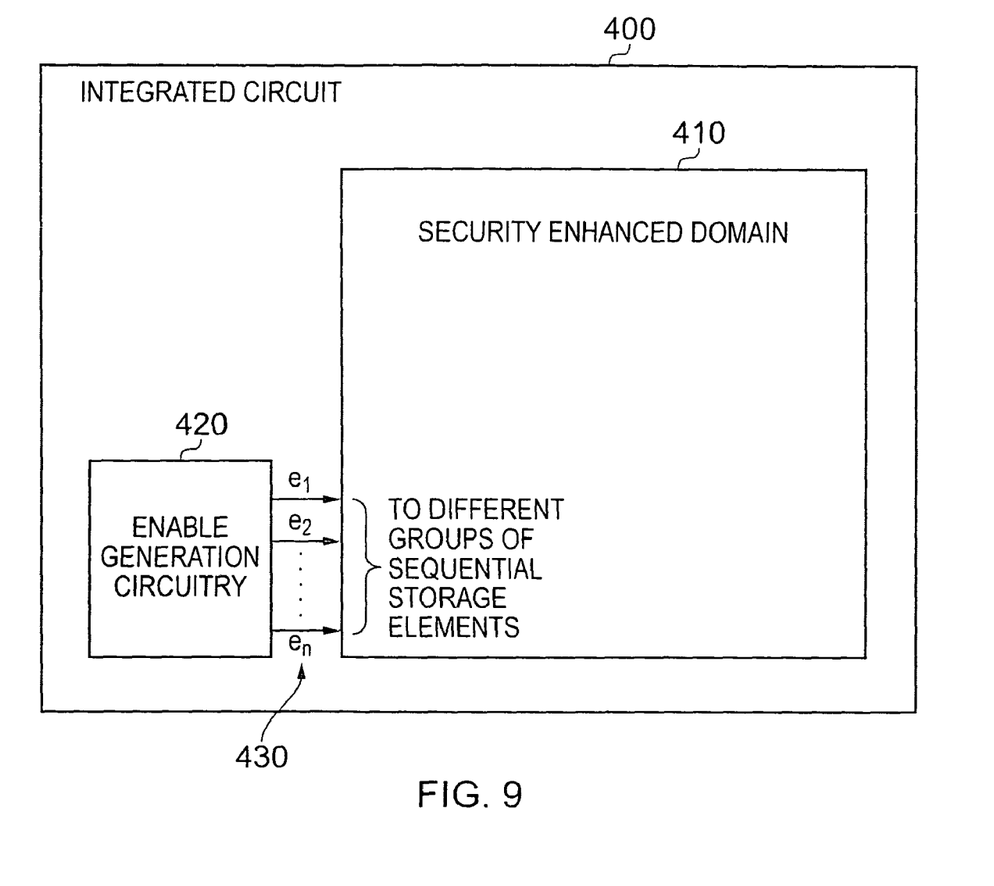
FIG. 9 illustrates the use of the techniques of embodiments to the present invention in order to provide a security enhanced domain within an integrated circuit.

In one embodiment as shown in FIG. 9, multiple enable signals 430 are generated, with each enable signal being routed to a different group of sequential storage circuits. The sequential storage circuits forming a particular group do not have to be located in the same region of the integrated circuit, and instead may be spread throughout the integrated circuit. Further, the various enable signals can be asserted and de-asserted randomly or pseudo-randomly. By taking such measures, it can be seen that individual sequential storage circuits will flip their internal states at various times, which will make detection of the states stored within the various sequential storage circuits difficult, thereby improving security of the data stored within the integrated circuit. Further, since such state flipping within the sequential storage circuit does not require any alterations to downstream combinatorial logic, such measures have no effect on the operation of the integrated circuit, and hence provide a simple and attractive mechanism for improving security.

Although particular embodiments of the invention have been described herein, it will be apparent that the invention is not limited thereto, and that many modifications and additions may be made within the scope of the invention. For example, various combinations of the features of the following dependent claims could be made with the features of the independent claims without departing from the scope of the present invention.

We claim:

1. Sequential storage circuitry for an integrated circuit, comprising:

input circuitry for receiving an input data value to the sequential storage circuitry, and for generating an internal data value, the input circuitry receiving a first control signal which when asserted causes the input circuitry to generate as said internal data value an inverted version of the input data value, and which when not asserted causes the input circuitry to generate as said internal data value the input data value;

a storage structure for storing an indication of the internal data value; and output circuitry for generating, from the indication of the internal data value stored in the storage structure, an output data value for outputting from the sequential storage circuitry, the output circuitry receiving a second control signal derived from the first control signal, which causes the output circuitry to generate as said output data value an inverted version of the internal data value in the event that the input circuitry generated as said internal data value an inverted version of the input data value, and otherwise to generate as said output data value the internal data value.

2. Sequential storage circuitry as claimed in claim 1, wherein:

the storage structure is arranged to sample the internal data value generated by the input circuitry in the form that internal data value exists at a predetermined edge of a clock signal;

the first control signal is asserted before said predetermined edge of the clock signal so as to cause the inverted version of the input data value to be generated before the predetermined edge of the clock signal; and following assertion of the first control signal, the second control signal is asserted in response to said predetermined edge of the clock signal.

3. Sequential storage circuitry as claimed in claim 2, wherein a first time taken for the internal data value to transfer from the input of the storage structure to the output circuitry upon occurrence of the predetermined edge of the clock signal, and a second time taken for the second control signal to be generated responsive to said predetermined edge of the clock signal, are selected such that there is no change in the output data value resulting from the assertion of the first control signal.

4. Sequential storage circuitry as claimed in claim 2, wherein a first time taken for the internal data value to transfer from the input of the storage structure to the output circuitry upon occurrence of the predetermined edge of the clock signal, and a second time taken for the second control signal to be generated responsive to said predetermined edge of the clock signal, are selected such that a glitch is produced in the output data value resulting from the assertion of the first control signal, the glitch assisting in de-stressing combinatorial circuitry arranged to receive said output data value.

5. Sequential storage circuitry as claimed in claim 2, wherein the storage structure is a flip-flop storage structure, which is responsive to the predetermined edge of the clock signal to sample the internal data value generated by the input circuitry.

6. Sequential storage circuitry as claimed in claim 2, wherein the storage structure is a latch, and the input data value is constrained not to change during a first phase of the clock signal following the predetermined edge of the clock signal such that in a second phase of the clock signal the latch retains the internal data value existing at the time of the predetermined edge of the clock.

7. Sequential storage circuitry as claimed in claim 1, further comprising:
a scan/data multiplexer used to select between normal operation input data and test mode scan input data;
the input circuitry generating the inverted version of the input data value and employing the scan/data multiplexer in normal operation to produce the internal data value by selecting between the input data value and the inverted version of the input data value dependent on the first control signal.

8. Sequential storage circuitry as claimed in claim 1, wherein:
the storage structure outputs the internal data value and an inverted version of the internal data value;
the output circuitry generates the output data value and an inverted version of the output data value, and the output circuitry comprises multiplexer circuitry controlled by the second control signal;
whereby when the second control signal is asserted following assertion of the first control signal, the output circuitry outputs the inverted version of the internal data value as the output data value, and outputs the internal data value as the inverted version of the output data value.

9. Sequential storage circuitry as claimed in claim 1, wherein on assertion of the first control signal, the first control signal remains asserted for a predetermined period and is then de-asserted.

10. Sequential storage circuitry as claimed in claim 1, wherein the first control signal is asserted to anneal stress build-up in the storage structure.

11. Sequential storage circuitry as claimed in claim 10, wherein the stress build-up results from gate-source bias temperature instability in transistors forming the storage structure, and changing the internal data value in dependence on the first control signal anneals the stress build-up.

12. Sequential storage circuitry as claimed in claim 10, wherein the sequential storage circuitry is for use in a low activity domain of the integrated circuit.

13. Sequential storage circuitry as claimed in claim 1, wherein the first control signal is asserted and de-asserted in accordance with a security control scheme to hamper detection of the data value being represented by the internal data value stored in the storage structure.

14. An integrated circuit comprising a plurality of sequential storage circuits interposed by combinatorial circuitry, at least one of the sequential storage circuits being formed by the sequential storage circuitry of claim 1.

15. An integrated circuit as claimed in claim 14, further comprising:
latch circuitry for receiving the first control signal and for generating the second control signal following a predetermined edge of a clock signal.

16. An integrated circuit as claimed in claim 15, wherein multiple sequential storage circuits of said plurality are each formed by the sequential storage circuitry, each of said multiple sequential storage circuits receiving the first control signal, and the second control signal output by the latch circuitry.

17. An integrated circuit as claimed in claim 14, comprising a high activity domain and a low activity domain, at least the sequential storage circuits within the low activity domain each being formed by the sequential storage circuitry, such that stress build-up in the storage structures of those sequential storage circuits resulting from the low activity is annealed through changing of the internal data value dependent on the first control signal.

18. An integrated circuit as claimed in claim 14, wherein multiple sequential storage circuits of said plurality are each formed by the sequential storage circuitry, further comprising:
first control signal generation circuitry for generating at least one first control signal that is asserted and de-asserted in accordance with a security control scheme to hamper detection of the data values being represented by the internal data values stored in the storage structures of those multiple sequential storage circuits.

19. An integrated circuit as claimed in claim 18, wherein the multiple sequential storage circuits are grouped into a plurality of groups, the first control signal generation circuitry generating a separate first control signal for each group in said plurality.

20. A method of operating sequential storage circuitry for an integrated circuit, comprising the steps of:
receiving an input data value to the sequential storage circuitry, and generating an internal data value, when a first control signal is asserted an inverted version of the input data value being generated as said internal data value, and when the first control signal is not asserted the input data value being generated as said internal data value;
storing an indication of the internal data value in a storage structure of the sequential storage circuitry; and
generating, from the indication of the internal data value stored in the storage structure, an output data value for outputting from the sequential storage circuitry, the output data value generated being dependent on a second control signal derived from the first control signal, such that an inverted version of the internal data value is generated as said output data value in the event that an inverted version of the input data value was generated as said internal data value, and otherwise the internal data value is generated as said output data value.

* * * * *